(12) United States Patent
Fujii et al.

(10) Patent No.: US 7,298,022 B2
(45) Date of Patent: Nov. 20, 2007

(54) SEMICONDUCTOR SENSOR

(75) Inventors: Tetsuo Fujii, Toyohashi (JP); Tsuyoshi Fukada, Aichi-gun (JP); Kenichi Ao, Tokai (JP)

(73) Assignee: DENSO CORPORATION, Kariya (JP)

( * ) Notice: Subject to any disclaimer, the term of this patent is extended or adjusted under 35 U.S.C. 154(b) by 138 days.

(21) Appl. No.: 11/075,881

(22) Filed: Mar. 10, 2005

(65) Prior Publication Data

US 2005/0156309 A1    Jul. 21, 2005

Related U.S. Application Data

(62) Division of application No. 10/896,042, filed on Jul. 22, 2004, now Pat. No. 7,091,109, which is a division of application No. 10/091,497, filed on Mar. 7, 2002, now Pat. No. 6,787,866, which is a division of application No. 09/525,514, filed on Mar. 15, 2000, now Pat. No. 6,429,506.

(30) Foreign Application Priority Data

Mar. 19, 1999  (JP)  ................... 11-76566
Jul. 9, 1999    (JP)  ................... 11-196345

(51) Int. Cl.
    *H01L 23/544*    (2006.01)
(52) U.S. Cl. .............. 257/620; 257/737; 257/778; 257/E23.021
(58) Field of Classification Search .......... 257/619, 257/620, 737, 738, 778, E23.02, E23.021, 257/E23.179; 438/458, 459, 462, 977
    See application file for complete search history.

(56) References Cited

U.S. PATENT DOCUMENTS 4,921,564 A    5/1990    Moore
5,362,681 A    11/1994   Roberts, Jr. et al.
5,435,876 A    7/1995    Alfaro et al.
5,597,767 A    1/1997    Mignardi et al.
5,734,106 A *  3/1998    Caillat ............... 73/514.01
5,824,177 A    10/1998   Yoshihara et al.
5,864,063 A *  1/1999    Otani et al. .......... 73/514.32
6,069,392 A    5/2000    Tai et al.
6,107,685 A    8/2000    Nishiyama
6,114,191 A *  9/2000    Young et al. ............ 438/125
6,124,637 A    9/2000    Freyman et al.
6,165,885 A    12/2000   Gaynes et al.
6,198,165 B1   3/2001    Yamaji et al.

(Continued)

FOREIGN PATENT DOCUMENTS

JP    A-H06-347475    12/1994

(Continued)

*Primary Examiner*—Sue A. Purvis
*Assistant Examiner*—Benjamin Tzu-Hung Liu
(74) *Attorney, Agent, or Firm*—Posz Law Group, PLC

(57) ABSTRACT

A protective sheet is fixed to a jig, and regions of the protective sheet corresponding to regions where dicing-cut is to be performed are removed to form grooves. Then, a semiconductor wafer is bonded to the protective sheet at an opposite side of the jig, and the jig is detached from the protective sheet and the semiconductor wafer bonded together. After that, the semiconductor wafer is cut into semiconductor chips by dicing along the grooves of the protective sheet. Because the protective sheet is not cut by dicing, no scraps of the protective sheet is produced, thereby preventing contamination to the chips.

11 Claims, 13 Drawing Sheets

U.S. PATENT DOCUMENTS

| | | |
|---|---|---|
| 6,201,707 B1 * | 3/2001 | Sota .................... 361/761 |
| 6,204,564 B1 | 3/2001 | Miyata et al. |
| 6,208,525 B1 | 3/2001 | Imasu et al. |
| 6,232,650 B1 | 5/2001 | Fujisawa et al. |
| 6,245,593 B1 | 6/2001 | Yoshihara |
| 6,255,741 B1 | 7/2001 | Yoshihara |
| 6,287,885 B1 | 9/2001 | Muto et al. |
| 6,291,895 B1 | 9/2001 | Taniguchi et al. |
| 6,313,532 B1 | 11/2001 | Shimoishizaka et al. |
| 6,316,288 B1 | 11/2001 | Hashimoto |
| 6,333,565 B1 | 12/2001 | Hashimoto |
| 6,410,366 B1 | 6/2002 | Hashimoto |

FOREIGN PATENT DOCUMENTS

| | | |
|---|---|---|
| JP | A-H08-316496 | 11/1995 |
| JP | A-H08-250454 | 9/1996 |
| JP | A-H09-027466 | 1/1997 |
| JP | A-H10-242253 | 9/1998 |
| JP | A-H11-340369 | 12/1999 |

* cited by examiner

SEMICONDUCTOR SENSOR

CROSS REFERENCE TO RELATED APPLICATIONS

This application is a division of application Ser. No. 10/896,042 filed on Jul. 22, 2004 now U.S. Pat. No. 7,091,109, which is in turn a division of application Ser. No. 10/091,497, filed on Mar. 7, 2002 (now U.S. Pat. No. 6,787,866), which is in turn a division of application Ser. No. 09/525,514, filed on Mar. 15, 2000 (now U.S. Pat. No. 6,429,506), which is based upon and claims the benefit of Japanese Patent Application No. 11-76566 filed on Mar. 19, 1999, and No. 11-196345 filed on Jul. 9, 1999, the contents of which are incorporated herein by reference.

BACKGROUND OF THE INVENTION

1. Field of the Invention

This invention relates to a method for producing a semiconductor device by dicing a semiconductor wafer covered with a protective sheet along scribe lines, a semiconductor device produced by the method, and a wafer detachment apparatus usable for the method.

2. Description of the Related Art

As disclosed in many documents such as JP-A-10-242253, JP-A-7-99172, U.S. Pat. No. 5,824,177, and U.S. Pat. No. 5,362,681, when a semiconductor wafer having plural movable portions is divided into plural chips, a protective sheet is attached to the semiconductor wafer to protect the movable portions. In this state, the semiconductor wafer is diced into the chips together with the protective sheet at a dicing-cut step.

In the conventional method described above, however, because the protective sheet is diced together with the semiconductor wafer, scraps of the protective sheet such as adhesive organic particles are produced by cutting and attached to the chips as contaminants. The scraps may be attached to electrodes formed on each chip to adversely affect the electrodes in electrical and mechanical connection.

Further, in the conventional method, the protective sheet needs to be removed from the chips after the dicing-cut step is carried out. If the protective sheet is bonded to the semiconductor wafer firmly, the removal of the protective sheet is difficult and may cause damage to the chips due to the resulting stress. Therefore, the protective sheet is bonded to the semiconductor wafer with a relatively small amount of adhesion. Because of this, the protective sheet is easily separated from the semiconductor wafer during the dicing-cut step. As a result, the protective layer cannot protect the movable portions sufficiently.

SUMMARY OF THE INVENTION

The present invention has been made in view of the above problems. An object of the present invention is to prevent a semiconductor device from being contaminated by scraps of a protective sheet produced when a semiconductor wafer covered with the protective sheet is cut by dicing to form the semiconductor device. Another object of the present invention is to provide a semiconductor device and a method for producing the semiconductor device capable of preventing separation of the protective sheet.

According to one aspect of the present invention, in a method for producing a semiconductor device, after a protective sheet is fixed to a jig, a dicing-cut region of the protective sheet is removed. Then, a semiconductor wafer is bonded to the protective sheet, and the jig is detached from the protective sheet and the semiconductor, whereby the semiconductor wafer is exposed from the dicing-cut region of the protective sheet. Then, the semiconductor wafer is cut by dicing along the dicing-cut region to form the semiconductor device.

In the method described above, because the dicing-cut region of the protective sheet is removed and the protective sheet is not cut by dicing, any scraps of the protective sheet are not produced by dicing. As a result, the semiconductor device is not contaminated by the scraps. Because a dicing blade does not contact the protective sheet, the separation of the protective sheet is not caused by the dicing blade.

According to another aspect of the present invention, a semiconductor device has a semiconductor chip provided by cutting a semiconductor wafer by dicing, and a protective member disposed on the semiconductor chip. A peripheral edge portion of the protective sheet is provided at an inside of the peripheral edge portion of the semiconductor chip. Because the peripheral edge portion of the protective sheet is provided at the inside of the peripheral edge portion of the semiconductor chip, a dicing blade does not contact the protective member when cutting the semiconductor wafer. Therefore, generation of scraps and separation of the protective member can be prevented.

The inventors have further studied and examined the method for producing the semiconductor device, and found out that when adhesion between the protective sheet and the jig was strong, the semiconductor wafer was easily broken when the protective sheet and the semiconductor wafer were detached from the jig.

To solve the problem described above, according to the present invention, the protective sheet and the semiconductor wafer are detached from the jig by a pressure applied to the protective sheet from a side of the jig. Accordingly, the semiconductor wafer can be detached without being damaged together with the protective sheet. Workability and throughput for detaching the semiconductor wafer from the jig are also improved.

Further, to solve the problem describe above, according to another aspect of the present invention, a wafer detachment device is used for detaching the semiconductor wafer and the protective sheet from the jig. The wafer detachment device has the jig for fixedly holding the protective sheet, and pressurizing means for applying a pressure to the protective sheet. Accordingly, the protective sheet is detached from the jig by the pressure together with the semiconductor device readily.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

Preferred embodiments of the present invention are explained with reference to accompanying drawings. In the embodiments, a semiconductor wafer means a wafer before and after a dicing-cut step is carried out provided that the wafer has a contour of its initial state.

First Embodiment

In a first preferred embodiment, a method for producing a semiconductor device according to the present invention is applied to various semiconductor devices including movable portions such as a surface micro-processed type acceleration sensor, a rotation angle sensor, and a reflecting digital micro-mirror projector (DMD). The method in the first embodiment is explained referring to FIGS. 1A to 1E and 2A to 2C.

Figure 1A:
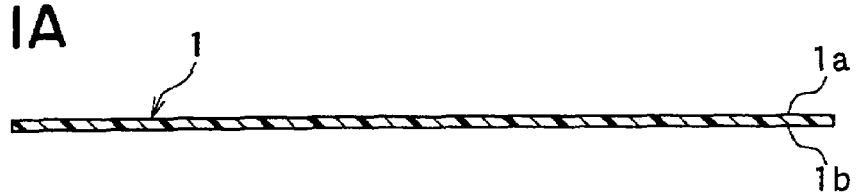
FIGS. 1A to 1E and 2A to 2C are cross-sectional views showing a method for producing a semiconductor device in a stepwise manner in a first preferred embodiment.
Figure 1B:
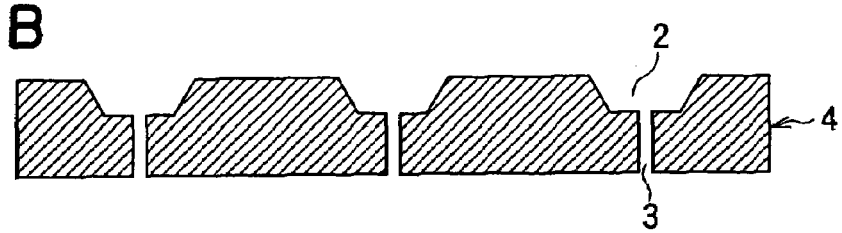

First, as shown in FIG. 1A, a protective sheet 1 is prepared. The protective sheet 1 is formed from an UV-setting adhesive sheet, a base of which is made of, for example, polyolefine. The protective sheet 1 has an adhesive surface 1a for covering a semiconductor wafer 11, and a surface 1b at an opposite side of the adhesive surface 1a. Further, a jig 4 shown in FIG. 1B is disposed on a heater block (not shown). The jig 4 has recesses 2 and holes 3 for vacuum absorption. The heater block performs the vacuum absorption in cooperation with the holes 3 of the jig 4.

Figure 1C:
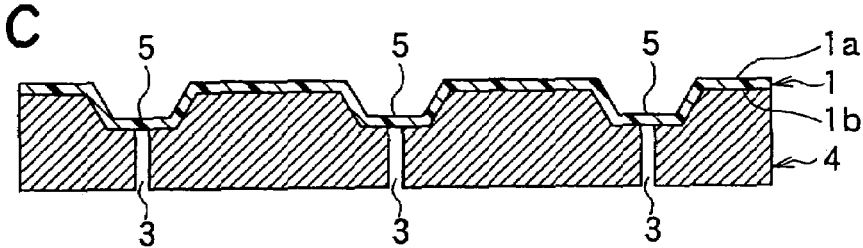

Next, at a jig fixation step shown in FIG. 1C, the protective sheet 1 is disposed on the jig 4 with the surface 1b contacting the jig 4 and the adhesive surface 1a exposed upward. Then, the protective sheet 1 is dented along the recesses 2 by vacuum absorption performed through the holes 3. Because the jig 4 is heated to a temperature in a range of 40 to 200° C., protective cap portions 5 are formed on the protective sheet 1 with shapes corresponding to the recesses 2. The protective sheet 1 is fixed to the jig 4 by an attraction through the holes 3.

Figure 1D:
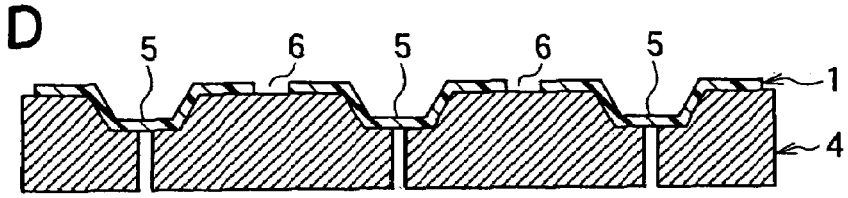

At a protective sheet region removal step shown in FIG. 1D, the jig 4 is detached from the heater block along with the protective sheet 1 fixed to the jig 4. The jig 4 is then disposed on a base (not shown), which can absorb under vacuum as the heater block. Then, regions of the protective sheet 1 where dicing-cut is to be performed at a dicing-cut step described below are removed by cutting, thereby forming grooves 6 at the removed regions (dicing-cut regions). As a result, the protective sheet 1 is divided into regions having sizes approximately the same as those of semiconductor chips to be formed. At this step, because the protective sheet 1 is fixed to the jig 4 by vacuum absorption, the protective sheet 1 is not loosed into pieces after the protective sheet region removal step is carried out.

Figure 1E:
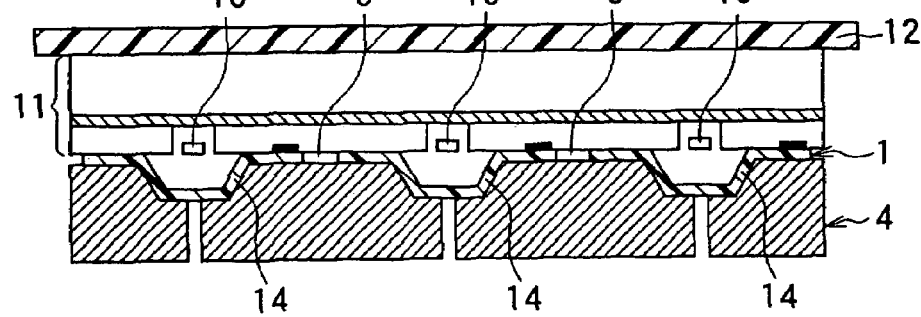

Next, at a wafer bonding step shown in FIG. 1E, the semiconductor wafer 11 having movable portions 10 and made of, for example, silicon is bonded to the protective sheet 1, by adhesives so that the movable portions 10 face the cap portions 5. The protective sheet 1 may be a pressure sensitive adhesive sheet so that the semiconductor wafer 11 is bonded thereto. The positioning between the protective sheet 1 and the semiconductor wafer 11 is performed by alignment keys formed on the protective sheet 1 and the semiconductor wafer 11 or by a CCD camera. A roller may be rolled on the semiconductor wafer 11 by heating the semiconductor wafer 11 so that the semiconductor wafer 11 can be bonded to the protective sheet 1 without producing voids in the adhesives and lessening adhesion of the adhesives.

Then, a dicing sheet 12 is attached to the other surface of the semiconductor wafer 11 at an opposite side of the movable portions 10. The dicing sheet 12 may be attached to the semiconductor wafer 11 before the semiconductor wafer 11 is bonded to the protective sheet 1. By performing the wafer bonding step described above, as shown in FIG. 1E, the semiconductor wafer 11 is attached to protective members (protective caps) 14 at one surface, and is attached to the dicing sheet 12 at the other surface. Each of the protective members 14 has a corresponding one of the cap portions 5 and a size the same as that of each semiconductor chip, and is attached to the semiconductor wafer 11 while being fixed to the jig 4. In FIG. 1E, although only one movable portion 10 is indicated in each chip region, several movable portions 10 are provided in each chip region usually.

Figure 2A:
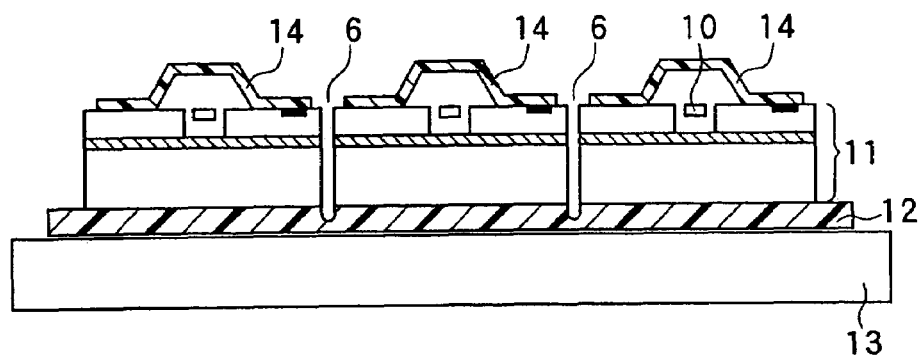

Successively, at the dicing-cut step shown in FIG. 2A, after the jig 4 is detached from the protective sheet 1 (protective members 14), the semiconductor wafer 11 is fixed to a dicing base 13 by vacuum absorption. In FIG. 2A, a detailed structure of the dicing base 13 is omitted. Then, the dicing-cut is performed along the grooves 6 where the protective sheet 1 is removed, whereby the semiconductor wafer 11 is divided into the semiconductor chips. At that time, the dicing sheet 12 is not cut completely. The semiconductor chips are protected by the respective protective members 14.

In this dicing-cut step, the protective sheet 1 is not cut. Therefore, any scraps of the protective sheet 1 are not produced to remain on the semiconductor chips, thereby preventing contamination of the chips. In addition, because a dicing blade hardly contacts the protective members 14 at the dicing-cut step, separation of the protective members 14 is not caused by the dicing blade.

Figure 2B:
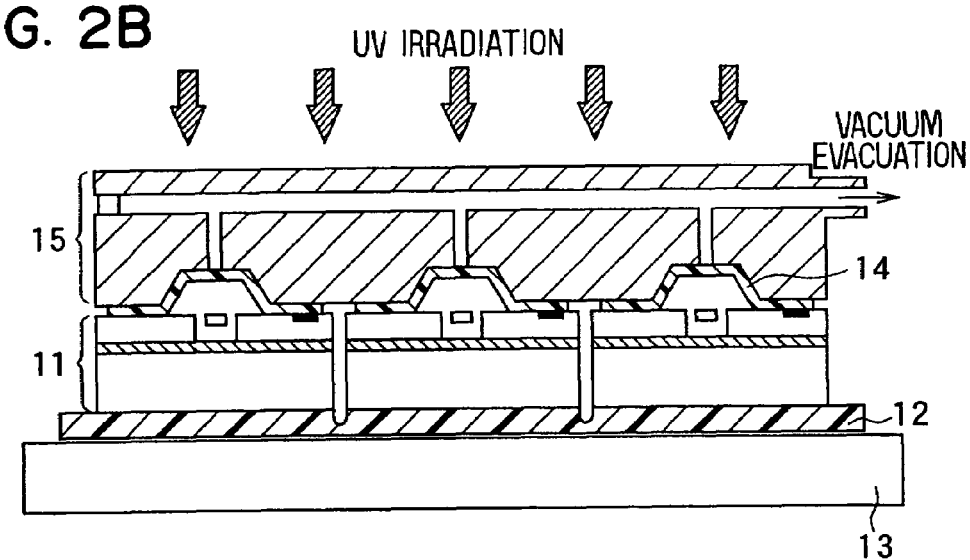
Figure 2C:
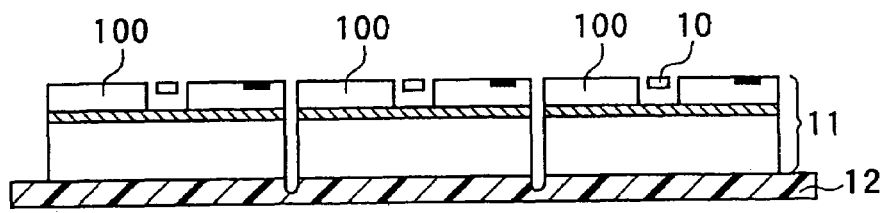

Because the protective sheet 1 needs not be attached to the semiconductor wafer 11 so firmly, the removal of the protective members 14 is easy. At a protective member removal step, as shown in FIG. 2B, a quartz glass jig 15 capable of performing vacuum absorption similarly to the jig 4 is disposed on the protective members 14 covering the semiconductor wafer 11. Then, UV irradiation is performed through the quartz glass jig 15 so that the adhesive is hardened to have lessened adhesion, and the protective members 14 are removed by the vacuum absorption. Accordingly, the state shown in FIG. 2C is provided.

The quartz glass jig 15 may have recesses as the jig 4 described above. Otherwise, the quartz glass jig 15 may have only holes for vacuum absorption at positions corresponding to flat faces of the protective members 14. Each semiconductor chip (semiconductor device) 100 formed by removing the protective members 14 can be handled as an ordinal IC chips. Although the quartz glass jig 15 is used to remove the protective members 14 in the present embodiment, other materials are usable as the jig 15 provided that the materials can transmit UV. The UV irradiation may be performed using a mirror or an optical fibers provided that the entire wafer surface is irradiated with UV.

When the protective sheet 1 is made of a heat-contraction type plastic film, the grooves 6 are widened due to heat contraction of the protective sheet 1 after the protective sheet region removal step is carried out. Therefore, the removed regions of the protective portions 1 can be decreased. Also, because it is difficult for the dicing blade to contact the protective sheet 1 at the dicing-cut step, the dicing-cut step can be performed more readily. Preferably, the heat-contraction type plastic film is selected from poly-olefine family films such as a polyethylene film and a polypropylene film and films processed by drawing such as a polyvinyl chloride film and a polyester film.

In the present embodiment, the protective sheet 1 is fixed to the jig 4 by vacuum absorption. Therefore, the protective sheet 1 can be fixed to the jig 4 and be detached from the jig 4 readily without being damaged. Also, because the protective sheet 1 is not cut at the dicing-cut step, the life-time of the dicing blade is improved.

Second Embodiment

In a second preferred embodiment, the protective members (protective caps) 14 are formed similarly to the first embodiment. Differences from the first embodiment are that the semiconductor wafer 11 has pad portions 21 for being electrically connected to external circuits by wire bonding (see FIG. 3E), and that the protective members 14 are not removed and remain in products. Therefore, the protective members 14 need to be partially removed at portions corresponding to the pad portions 21. The main differences from the first embodiment are described in more detail below. It should be noted that the same parts as those in the first embodiment are assigned to the same reference numerals in the second embodiment and other embodiments described below.

Figure 3A:
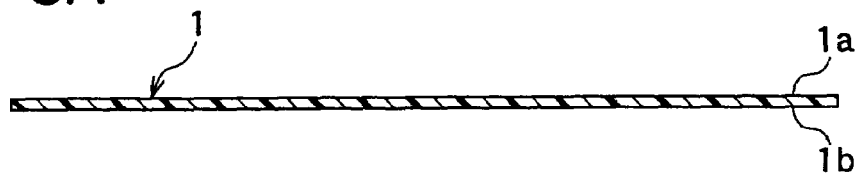
FIGS. 3A to 3E, 4A and 4B are cross-sectional views showing a method for producing a semiconductor device in a stepwise manner in a second preferred embodiment.
Figure 3B:
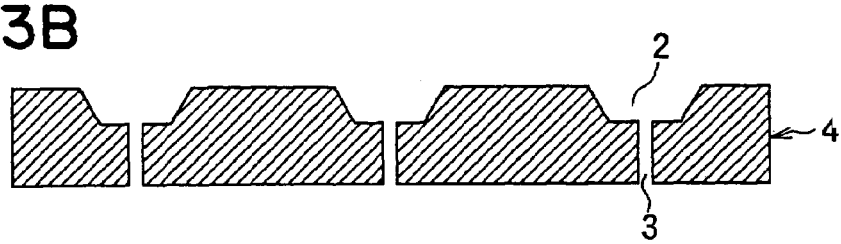
Figure 3C:
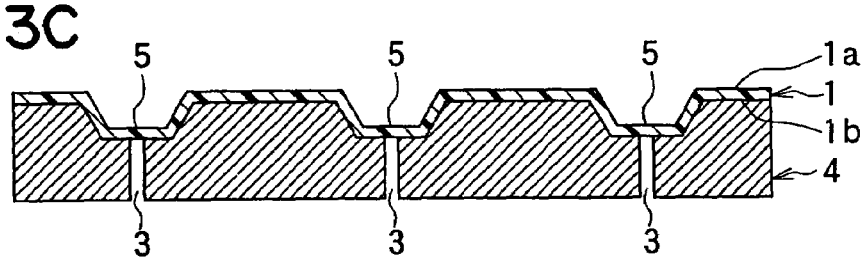
Figure 3D:
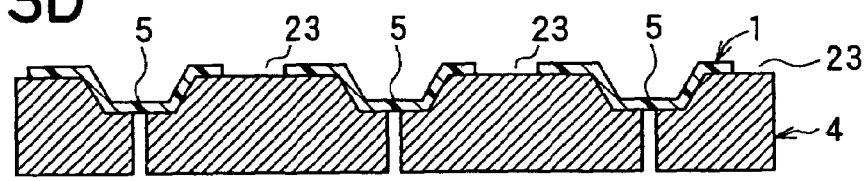

FIGS. 3A to 3E, 4A, and 4B schematically show the method for producing the semiconductor device in the second embodiment in a stepwise manner. The steps shown in FIGS. 3A, 3B and 3C are performed in substantially the same manner as those shown in FIGS. 1A, 1B, and 1C. At a protective sheet region removal step shown in FIG. 3D, regions of the protective sheet 1 where the dicing-cut is to be performed and regions of the protective sheet 1 corresponding to the pad portions 21 are removed as in the step shown in FIG. 1D to form opening portions 23. The regions corresponding to the pad portions 21 may be removed from the protective sheet 1 in a sheet state by pressing or the like before the protective sheet region removal step is carried out.

Figure 3E:
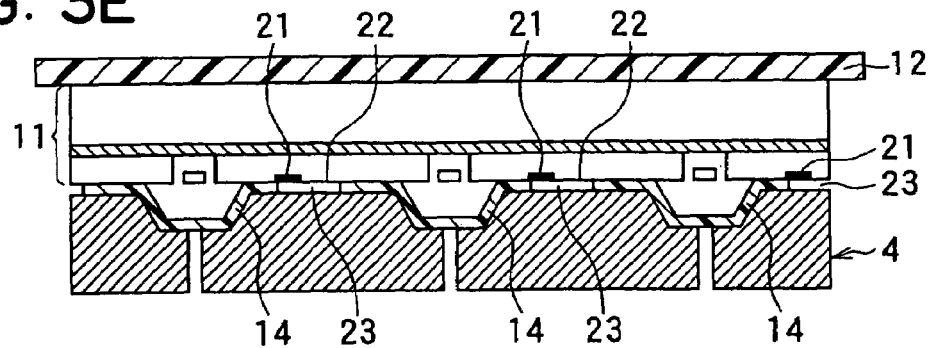

Next, at a wafer bonding step shown in FIG. 3E, the semiconductor wafer 11 is bonded to the protective sheet 1 so that the pad portions 21 are exposed to the opening portions 23. Accordingly, both the pad portions 21 and dicing-cut portions 22 are exposed to the respective opening portions 23. The other procedure at the wafer bonding step is substantially the same as that in the first embodiment. In the present embodiment, because the protective members 14 need not be removed, the protective sheet 1 can be bonded firmly. This is preferable to prevent the separation of the protective sheet 1. It is not always necessary to expose the pad portions 21 entirely. The pad portions 21 may be partially exposed from respective windows for wire bonding.

Figure 4A:
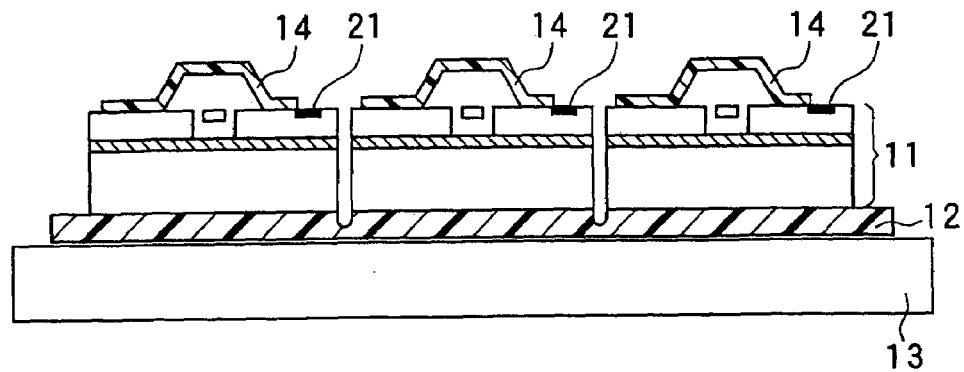
Figure 4B:
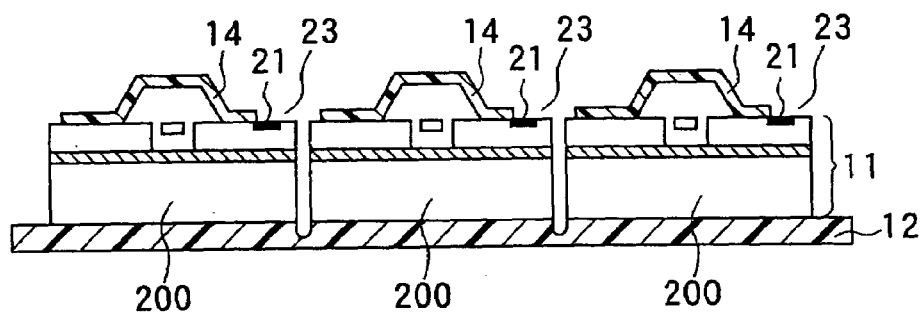

Next, as shown in FIG. 4A, the dicing-cut step is carried out substantially in the same manner as in the first embodiment, thereby cutting the semiconductor wafer 11 into semiconductor chips (devices) 200. In the present embodiment, as shown in FIG. 4B, each semiconductor chip 200 holds each protective member 14. After the dicing-cut step is carried out, the semiconductor chips 200 are detached from the dicing sheet 12. Then, a wire-bonding step is performed to each semiconductor chip 200 so that wires are bonded to the pad portions 21 exposed from the opening portion 23 of the protective member 14. The pad portions 21 are preferably cleaned before the wire-bonding step.

Figure 5:
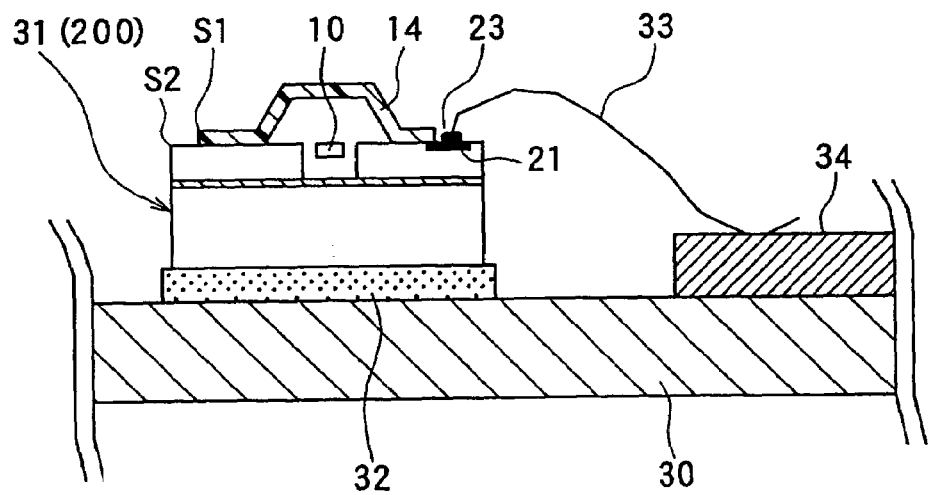
FIG. 5 is a cross-sectional view showing the semiconductor device in the second embodiment.

FIG. 5 shows a semiconductor device to which the wire-bonding step is performed, as an example. A semiconductor acceleration sensor 31 formed as one of the semiconductor chips 200 is disposed on a substrate 30 (for example, ceramic substrate, printed circuit board, or lead frame) through adhesive (adhesive sheet) 32, silver paste or the like by handling of a robot arm or the like. Next, a wire 33 made of gold, aluminum, or the like is bonded onto a pad portion 21 and a terminal 34 disposed on the substrate 30. Thus, the wire-bonding step is carried out.

Figure 6:
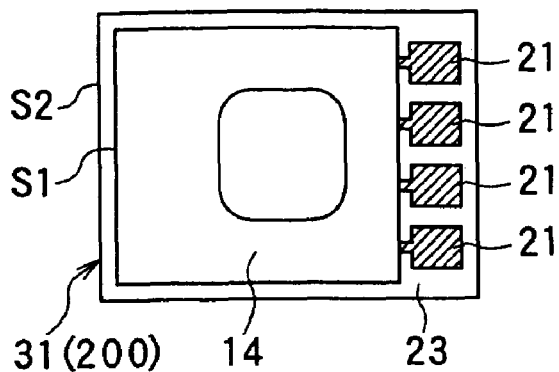
FIG. 6 is a plan view schematically showing the semiconductor device in the second embodiment.
Figure 7A:
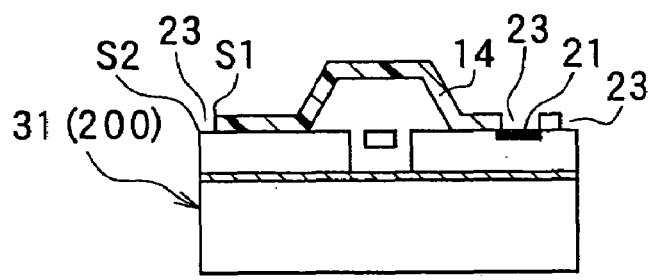
FIG. 7A is a cross-sectional view schematically showing a modified semiconductor device in the second embodiment.
Figure 7B:
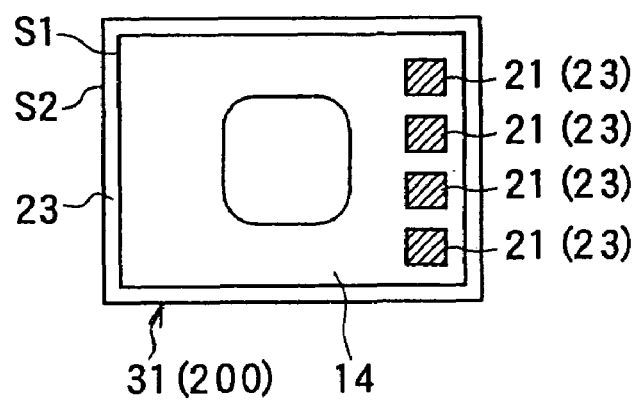
FIG. 7B is a plan view schematically showing the modified semiconductor device of FIG. 7A.

FIG. 6 shows the acceleration sensor 31 (semiconductor chip 200) from a side of the protective member 14. As shown in FIG. 6, the protective member 14 covers the acceleration sensor 31 except the dicing-cut portion 22 and the pad portions 21. The opening portion 23 is a portion not covered with the protective member 14. Further, FIGS. 7A and 7B show a case where the pad portions 21 are partially exposed from the protective member 14, i.e., the opening portions 23 are formed to partially expose the pad portions 21.

Thus, according to the present embodiment, in addition to the same effects as those in the first embodiment, the wire-bonding step can be performed without removing the protective sheet 1 (protective member 14) from the semiconductor chip 200. Because it is not necessary to remove the protective member 14 after the dicing-cut step, the protective sheet 1 can be bonded to the wafer firmly. As a result, the separation of the protective sheet 1 can be prevented more properly.

Third Embodiment

Figure 8A:
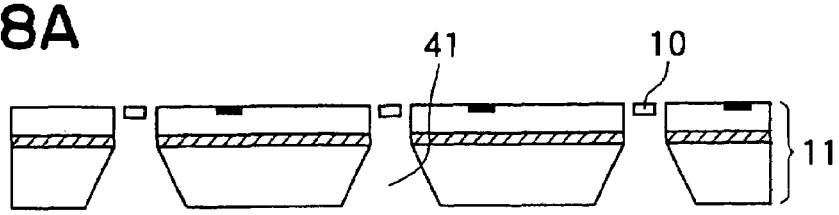
FIGS. 8A to 8F are cross-sectional views showing a method for producing a semiconductor device in a stepwise manner in a third preferred embodiment.

FIGS. 8A to 8F show a method for producing a semiconductor device in a stepwise manner in a third preferred embodiment. In the first and second embodiments, the semiconductor wafer 11 is processed from one surface thereof. To the contrary, in the present embodiment, the semiconductor wafer 11 is processed from front and back surfaces thereof. That is, as shown in FIG. 8A, the semiconductor wafer 11 in the present embodiment has back surface processed portions 41 formed as opening portions by etching or the like performed from the back surface. The movable portions 10 are exposed from both front and back surfaces of the semiconductor wafer 11.

Figure 8B:
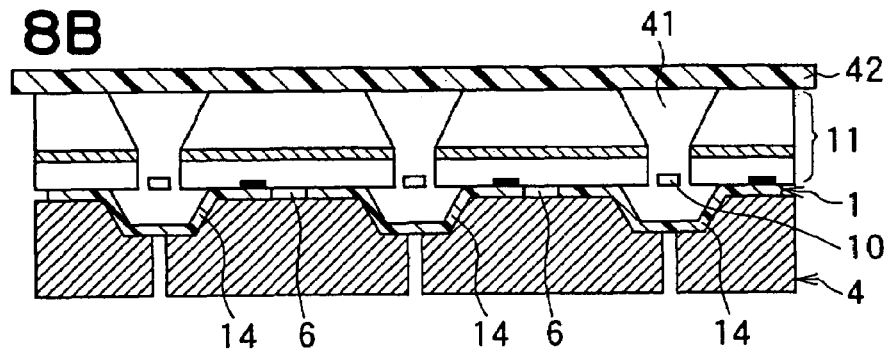

At a back side adhesive sheet bonding step, an adhesive sheet (back side protective sheet) 42 is bonded to the back surface of the semiconductor wafer 11 to protect the back surface. Further, at the wafer bonding step, the protective sheet 1, which is processed as in the first embodiment to have the grooves 6, is bonded to the front surface of the semiconductor wafer 11 while being fixed to the jig 4. This state is shown in FIG. 8B.

Figure 8C:
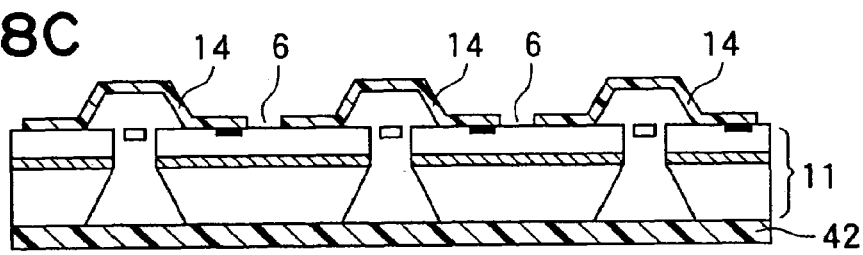
Figure 8D:
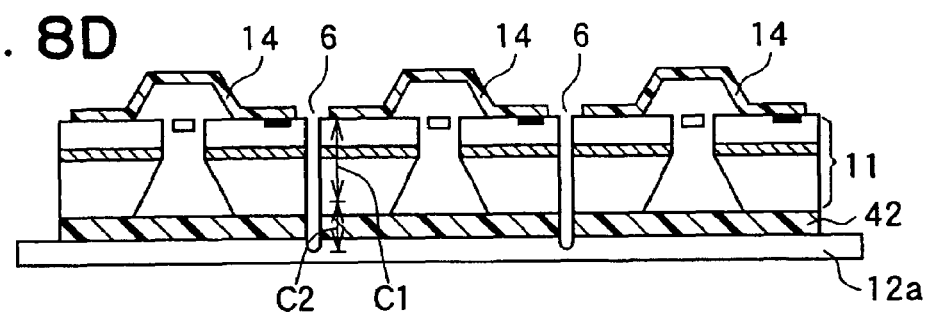

Then, as shown in FIG. 8C, the protective sheet 1 is detached from the jig 4. After that, as shown in FIG. 8D, the semiconductor wafer 11 is fixed to the dicing base (not shown in FIG. 8D) by vacuum absorption through a dicing tape 12a at the side of the adhesive film 42. Then, the dicing-cut step is carried out as in the first embodiment. The dicing tape 12a has the same function as that of the dicing sheet 12, and is not cut completely.

Figure 8E:
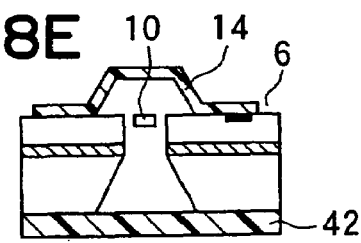
Figure 8F:
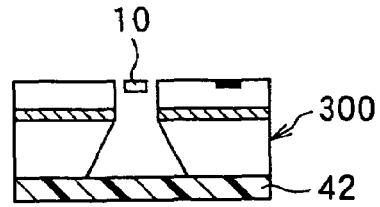

Accordingly, the semiconductor wafer 11 is divided into chips. As shown in FIG. 8E, each chip is protected by the protective member 14 at the front surface side thereof, and by the adhesive film 42 at the back surface side thereof. Then, as in the first embodiment, the protective member 14 is removed, thereby providing a semiconductor chip (device) 300 shown in FIG. 8F. The semiconductor chip 300 can be handled as an ordinal IC chip.

Figure 9:
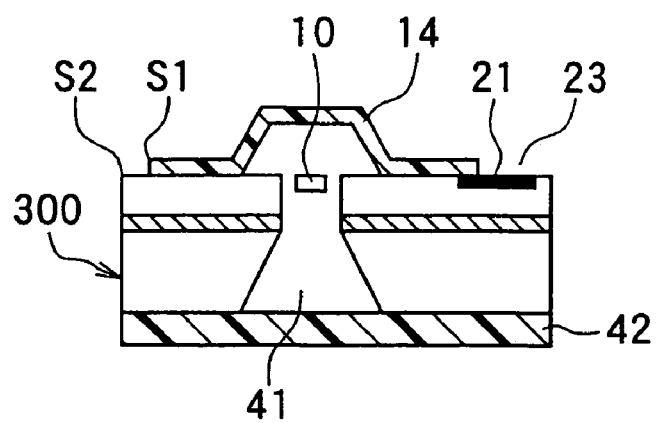
FIG. 9 is a cross-sectional view showing a modified semiconductor device in the third embodiment.

The present embodiment can be combined with the second embodiment in the formation of the protective member 14. FIG. 9 shows the modification. The protective member 14 protecting the front surface of the semiconductor chip 300 is formed to expose the pad portions 21 and the dicing-cut portion 22 from an opening portion 23. Accordingly, the wire-bonding step can be performed to the semiconductor chip 300 similarly to the acceleration sensor 31 shown in FIG. 5.

Thus, according to the present embodiment, the same effects as those in the first and second embodiments can be provided. In addition, even when the movable portions 10 are exposed from both surfaces of the semiconductor wafer 11, the movable portions 10 can be protected appropriately.

At the dicing-cut step, two types of dicing blades may be used in accordance with the characteristics of the adhesive sheet 42 to lengthen the life-time of the dicing blades. Specifically, a first blade cuts the semiconductor wafer 11 to some extent as indicated by arrow C1 in FIG. 8D, and then, a second blade cuts the remaining semiconductor wafer 11, the adhesive film 42, and the dicing tape 12a as indicated by arrow C2 in FIG. 8D. The second blade is thicker than the first blade and made of material different from that of the first blade. Thus, two-step cutting may be carried out. When the thickness of the protective sheet 1 (protective member 14) is increased to, for example, 50 μm, the semiconductor wafer 11 can be cut from the back surface thereof.

Figure 10:
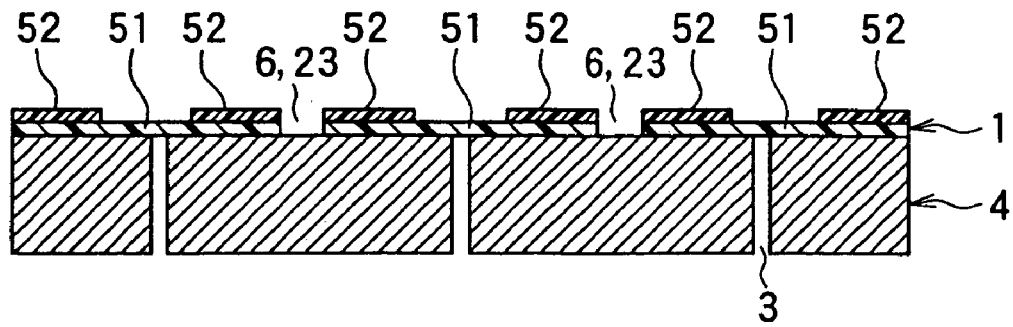
FIG. 10 is a cross-sectional view showing a case where a flat protective member is used.

The protective member 14 has the cap portion 5 not to contact each movable portion 10 in the embodiments described above. The cap portion 5 is formed by the jig 4 having the recesses 2. However, as shown in FIG. 10, an adhesive 52 may be disposed on a flat protective member 51 where the movable portions 10 of the semiconductor wafer 11 do not conflict. Accordingly, the protective member 51 can be prevented from contacting the movable portions 10 by the adhesive 52. The protective member 51 is formed by disposing the adhesive 52 on the flat protective sheet 1, and by forming the grooves 6 or the opening portions 23 in the protective sheet 1. In this case, the jig 4 can dispense with the recesses 2, resulting in low cost.

Fourth Embodiment

Figure 11A:
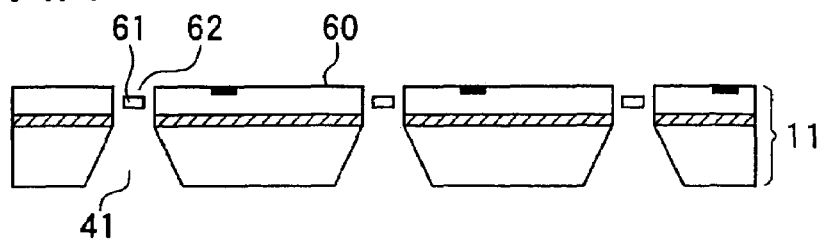
FIGS. 11A to 11E are cross-sectional views showing a method for producing a semiconductor device in a stepwise manner in a fourth preferred embodiment.
Figure 11B:
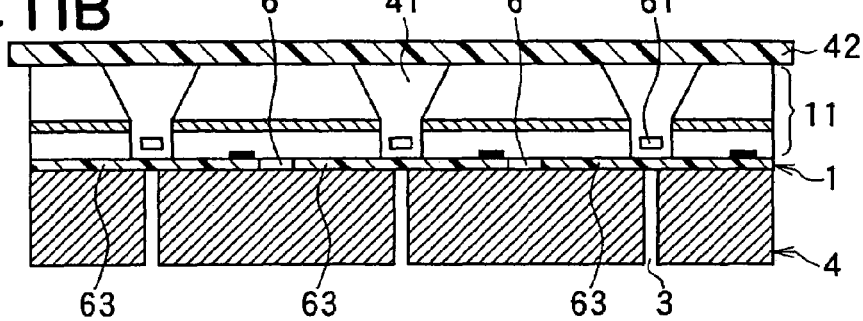

FIGS. 11A to 11E show a method for producing a semiconductor device in a stepwise manner in a fourth preferred embodiment. In the fourth embodiment, as shown in FIG. 11A, movable portions 61 are formed in the semiconductor wafer 11 at a depth in a range of approximately 0.5 to 100 μm from a surface 60 of the wafer 11. In the present embodiment, specifically, a depth of a recess 62 defined by each movable portion 61 and the surface 60 is set to approximately 3 μm. In this state, a protective member (protective cap) 63 may be flat. Therefore, in the present embodiment, the jig fixation step, the protective sheet region removal step, the wafer bonding step, the back side protective sheet bonding step are performed as described above, while keeping the protective film 1 flat without forming the cap portions 5, thereby forming the state shown in FIG. 11B.

Figure 11C:
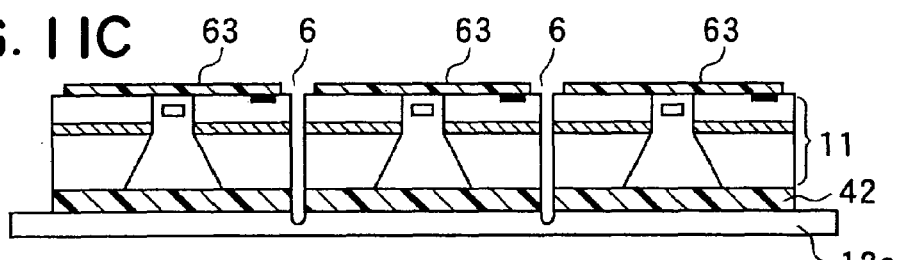
Figure 11D:
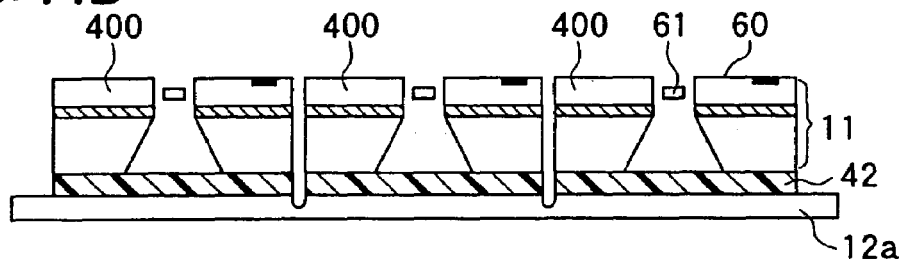
Figures 11E, 12:
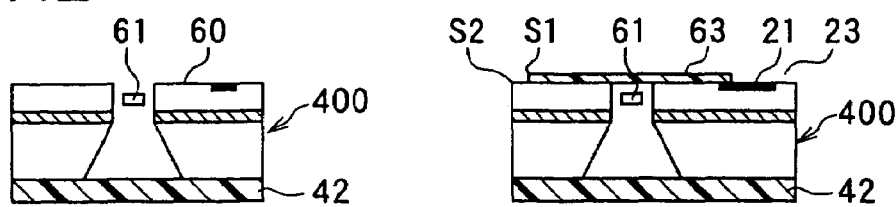
FIG. 12 is a cross-sectional view showing a modified semiconductor device in the fourth embodiment.

Next, as shown in FIGS. 11C and 11D, the dicing-cut step and the protective member removal step are carried out as in the third embodiment, thereby forming a semiconductor chip (semiconductor device) 400 shown in FIG. 11E. The protective member 63 maybe formed as in the second embodiment. FIG. 12 shows the semiconductor chip 400 formed accordingly to have the protective member 63 exposing the pad portions 21 therefrom. The semiconductor chip 400 shown in FIG. 12 can undergo the wire-bonding step while holding the protective member 63 as in the second embodiment.

Although the movable portions 10 are exposed from both front and back surfaces of the semiconductor wafer 11 in the present embodiment, the movable portions 10 may be exposed only from the front surface of the semiconductor wafer 11 as in the first and second embodiments provided that the movable portions 10 are formed in the wafer at a depth in a range of approximately 0.5 to 100 μm from the front surface of the wafer. Thus, according to the present embodiment, the same effects as those in the first to third embodiments can be provided by applying the flat protective sheet (protective member 63) 1 to the semiconductor wafer 11 having the structure described above.

Fifth Embodiment

In a fifth preferred embodiment, a semiconductor chip 500 formed by dicing a semiconductor wafer 11 has bumps exposed therefrom for being electrically connected to external portions. FIGS. 13A to 13E show a method for producing the semiconductor chip 500 in the fifth embodiment in a stepwise manner.

Figure 13A:
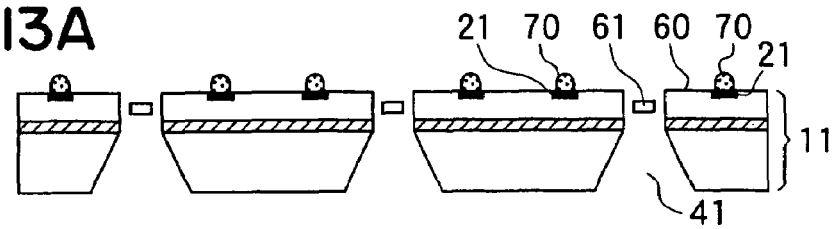
FIGS. 13A to 13E are cross-sectional views showing a method for producing a semiconductor device in a stepwise manner in a fifth preferred embodiment.

First, at a bump formation step shown in FIG. 13A, bumps 70 are formed on the front surface of the semiconductor wafer 11 to be electrically connected to the pad portions 21. The bumps 70 are formed from, for example, eutectic solder or solder including In. Stud bumps (wire bumps) composed of gold balls, which are formed by wire bonding of gold wires, may be adopted as the bumps 70.

At the jig fixation step, the protective sheet 1 is fixed to the jig 4. Then, at the protective sheet region removal step, the protective sheet 1 is partially removed by excimer laser or the like to have recesses 71 at regions corresponding to movable portions 61 of the semiconductor wafer 11. The recesses 71 have the same function as that of the cap portions 5 described above. If the movable portions 61 are provided in the wafer 11 at a depth in a range of approximately 0.5 to 100 μm from the wafer surface 60, it is not always necessary to form the recesses 71.

At the protective sheet region removal step, the grooves 6 are further formed in the protective sheet 1 fixed to the jig 4 at regions (scribe regions) where the dicing-cut is to be performed, thereby dividing the protective sheet 1 into pieces each having a size corresponding to each semiconductor chip. At that time, regions of the protective sheet 1 corresponding to the bumps 70 are also removed to form opening portions 72.

Figure 13B:
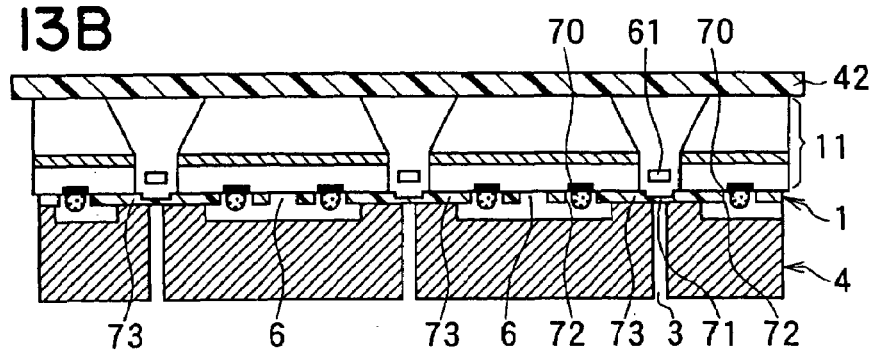

Next, the adhesive film 42 is bonded to the back surface of the semiconductor wafer 11. At the wafer bonding step in the present embodiment, protective members 73 formed by dividing the protective sheet 1 are bonded to the front surface of the semiconductor wafer 11 to expose the bumps 70 from the opening portions 72 while being fixed to the jig 4. As a result, the state shown in FIG. 13B is provided.

Figure 13C:
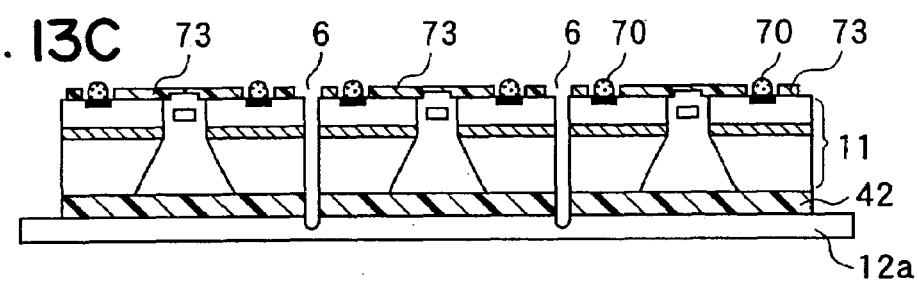
Figure 13D:
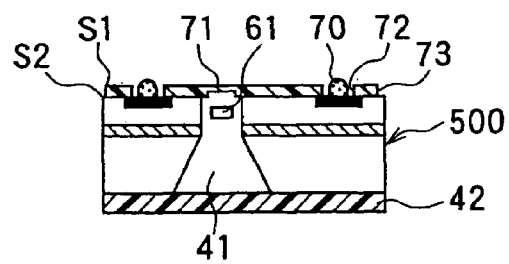

After the protective sheet 1 is detached from the jig 4, the dicing-cut step is carried out along the grooves 6 to divide the semiconductor wafer 11 into chips (see FIG. 13C). Accordingly, a semiconductor chip 500 shown in FIG. 13D is obtained. The semiconductor chip 500 is covered with the protective member 73 having the opening portions 72, and the bumps 70 are exposed from the opening portions 72.

Further, a substrate 80 having a conductive layer 81 thereon is prepared. The substrate 80 is preferably a ceramic, glass, glass-ceramic, or silicon substrate, or a printed circuit board. The conductive layer 81 is covered with an insulating layer 82 having opening portions so that the conductive layer 81 is partially exposed from the opening portions.

Figure 13E:
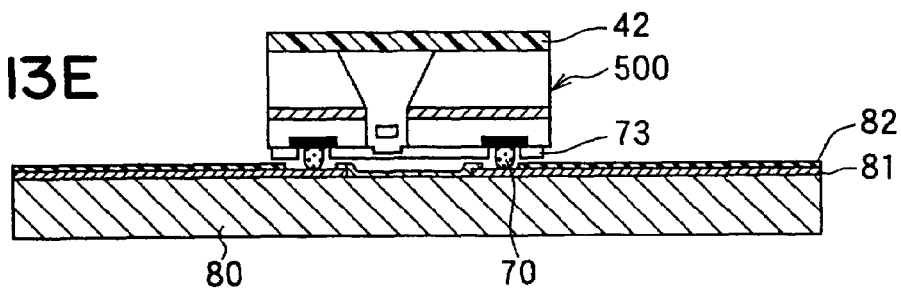

Then, as shown in FIG. 13E, the semiconductor chip 500 is disposed on the substrate 80 so that the bumps 70 contact the conductive layer 80 exposed from the opening portions. The bumps 70 and the conductive layer 81 are electrically connected to each other by reflow or thermo compression bonding. Thus, a face down bonding, i.e., a flip chip mounting can be carried out.

When the bumps 70 are made of eutectic solder, the melting point of the eutectic solder is approximately 180° C. In this case, preferably, the base constituting the protective member 73 is made of heat resistant resin such as polymide, and silicon adhesive is used as the adhesive described above. The bumps 70 can be made of solder including In, a melting point of which is lower than that of eutectic solder. The bumps 70 and the conductive layer 81 can be connected to each other in a solid phase by thermal compression bonding at a lower temperature. Otherwise, the bumps 70 may be connected by silver paste, which is generally used for fixation of chips onto a substrate.

Thus, according to the present embodiment, scraps of the protective member 73 are hardly produced because the dicing-cut is performed along the grooves 6. Because the protective member 73 needs not be removed from the semiconductor chip 500, the protective member 73 can be bonded to the semiconductor chip 500 firmly. As a result, the separation of the protective member 73 is prevented. The semiconductor chip 500 can be electrically connected to the external substrate 80 by the bumps 70 exposed from the opening portions 72 while holding the protective member 73 thereon.

At the protective sheet region removal step in the present embodiment, it is sufficient to form only the opening portions 72 corresponding to the bumps 70. The grooves 6 may not be formed. In this case, the protective sheet 1 is cut along with the wafer 11 at the dicing-cut step. Even in this case, because the protective member needs not be removed from the semiconductor chip and the protective sheet 1 can be bonded to the semiconductor wafer 11 firmly, scraps and separation of the protective sheet 1 can be prevented.

The protective sheet 1 in the present embodiment may have the cap portions 5 as shown in FIG. 1, or be flat as shown in FIGS. 10 and 11. The movable portions may not be exposed from both surfaces of the semiconductor wafer, but may be exposed from only one surface of the wafer as indicated in the first embodiment.

Incidentally, in the embodiments described above, as shown in FIGS. 5 to 7, 9, 12, and 13D, the semiconductor chip 200, 300, 400, or 500 is covered with the protective members 14, 15, 63, or 73, and a peripheral edge portion S1 of each protective member is disposed at an inside of a peripheral edge portion S2 of each semiconductor chip. This is because the region of the protective sheet 1 where the dicing-cut is preformed are removed at the protective sheet region removal step to form the grooves 6 or the opening portions 23. Because the peripheral edge portion S1 of the protective member is disposed at the inside of the peripheral edge portion S2 of the semiconductor chip, it is difficult for the dicing blade to contact the protective member. As a result, scraps of the protective sheet are hardly produced, and the separation of the protective member does not occur.

If the peripheral edge portions of the protective member and the semiconductor chip are provided at the same position, the protective member is liable to be separated from the chip when the side faces, the upper angular portions, the peripheral portion or the like of the chip are handled or pinched. As opposed to this, in the semiconductor chip 200 to 500, because the peripheral edge portion S1 of the protective member is disposed at the inside of the peripheral edge portion S2 of the chip not to contact other members, the separation of the protective member hardly occurs during the handling.

Sixth Embodiment

FIGS. 14A to 14D, 15A to 15C, and 16A to 16C show a method for producing a semiconductor device in a sixth preferred embodiment in a stepwise manner. The sixth embodiment uses a semiconductor wafer 11, both surfaces of which are processed as in the third embodiment. The semiconductor device in the present embodiment is used for a capacity detection type acceleration sensor. The semiconductor wafer 11 has back surface processed portions 41 as opening portions so that sensing portions 10a are exposed from front and back surfaces of the wafer 11. Each of the sensing portions 10a is composed of a movable electrode and a fixed electrode.

Figure 14A:
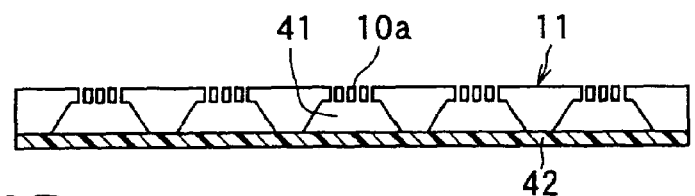
FIGS. 14A to 14D, 15A to 15C, and 16A to 16C are cross-sectional views showing a method for producing a semiconductor device in a stepwise manner in a sixth preferred embodiment.
Figure 14B:
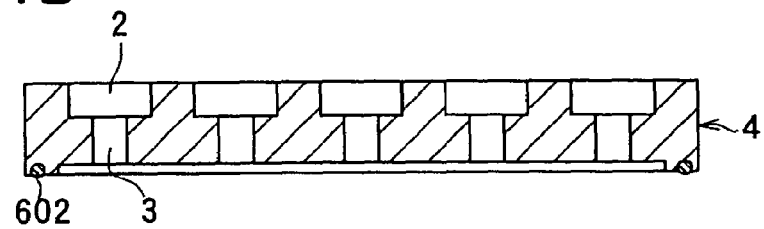

As shown in FIG. 14A, an adhesive film (adhesive sheet) 42 is attached to the back surface of the semiconductor wafer 11. FIG. 14B shows a jig 4 for forming protective cap portions 5. The jig 4 is a disc and has several recesses 2 on one surface thereof for forming the cap portions 5, and several holes (through holes) 3 communicating with the recesses 2 and opening at the other surface thereof for vacuum attraction.

Figure 14C:
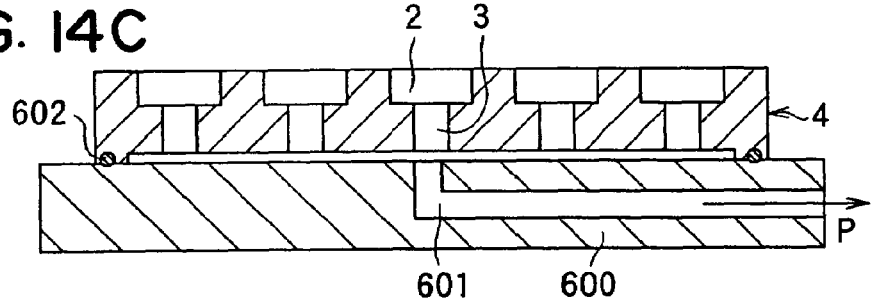

Then, as shown in FIG. 14C, a vacuum chuck stage 600 is disposed in contact with the jig 4 at an opposite side of the recesses 2. The vacuum chuck stage 600 has a pressure conduction hole 601 therein. The pressure conduction hole 601 communicates with the respective holes 3 at an end thereof and with a vacuum pump (decompressing pump) at the other end thereof. The jig 4 and the vacuum chuck stage 600 are sealed by an O-shaped ring 602. The vacuum attraction can be performed through the pressure conduction hole 601 in a direction indicated by an arrow P in FIG. 14C.

Figure 14D:
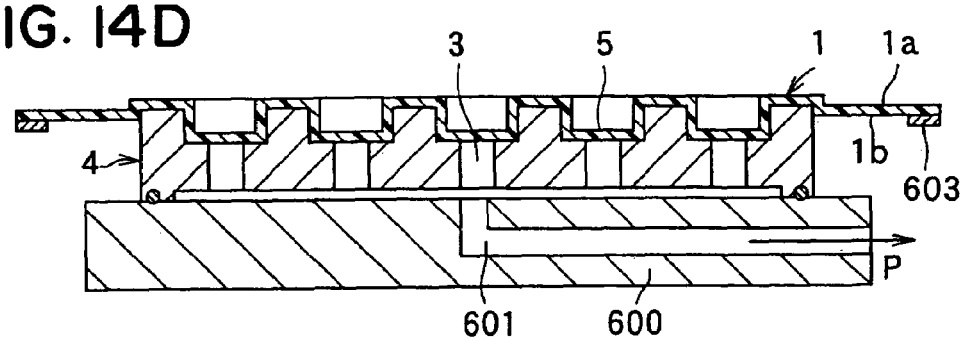

Next, as shown in FIG. 14D, the jig 4 and the vacuum chuck stage 600 are heated to a temperature (for example, approximately 70° C.) capable of deforming the protective sheet 1. After that, at the jig fixation step, the protective sheet 1 is fixed to the surface of the jig 4 while the vacuum pump is operated to perform the vacuum attraction. Accordingly, as described in the first embodiment, the protective sheet 1 is deformed to have the cap portions 5 denting from a side of an adhesive surface 1a toward a surface 1b along the recesses 2 by an attraction force imparted from the holes 3. At that time, a dicing frame 603 is disposed on an outer peripheral portion of the protective sheet 1 to keep flatness of the sheet 1.

Figure 15A:
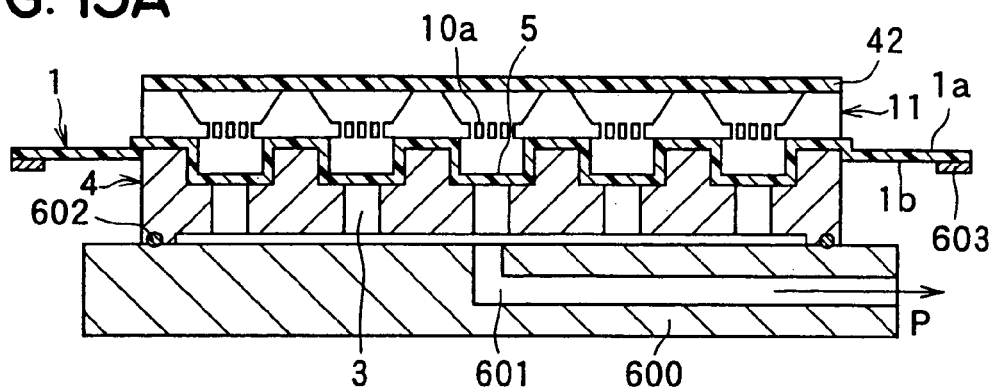

Next, at the wafer bonding step shown in FIG. 15A, the semiconductor wafer 11 and the protective sheet 1 are positioned to each other substantially in the same manner as in the first embodiment so that the sensing portions 10a face the respective cap portions 5. Then, the front surface of the semiconductor wafer 11 and the adhesive surface 1a of the protective sheet 1 are bonded together, and then are cooled down to a room temperature while keeping its state.

Figure 15B:
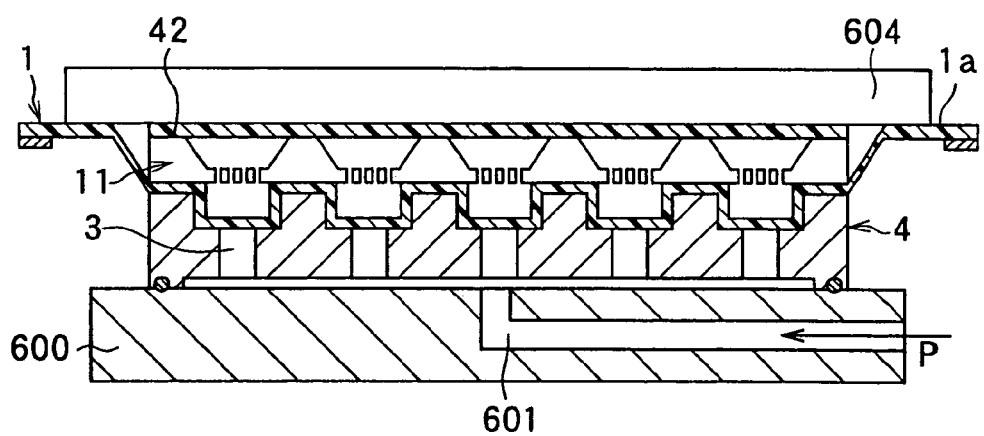

After cooled, at a reinforcement plate installation step shown in FIG. 15B, a reinforcement wafer 604 larger than that of the semiconductor wafer 1 in diameter is disposed on the back surface of the adhesive film 42 as a reinforcement plate. The protective sheet 1 is bonded to the reinforcement wafer 604 at the outer peripheral portion of the adhesive surface 1a thereof, whereby the protective sheet 1 and the semiconductor wafer 11 are fixed to the reinforcement wafer 604. As a result, the reinforcement wafer 604 is disposed to face the surface of the jig 4 where the recesses 2 are formed via the wafer 11 and the sheet 1 interposed therebetween.

Next, the jig 4 is detached from the protective sheet 1. In the present embodiment, a pressure is applied to the protective sheet 1 via the jig 4 in a direction indicated by an arrow P in FIG. 15B (pressurizing detachment step). Specifically, the connection of the end of the pressure conduction hole 601 is switched from the vacuum pump to a pressure supply apparatus not shown (for example, compressor). The switching of the connection can be performed by switching from a pipe (such as hose) system of the vacuum pump to a pipe system of the pressure supply apparatus by a switch bulb or the like.

Figure 15C:
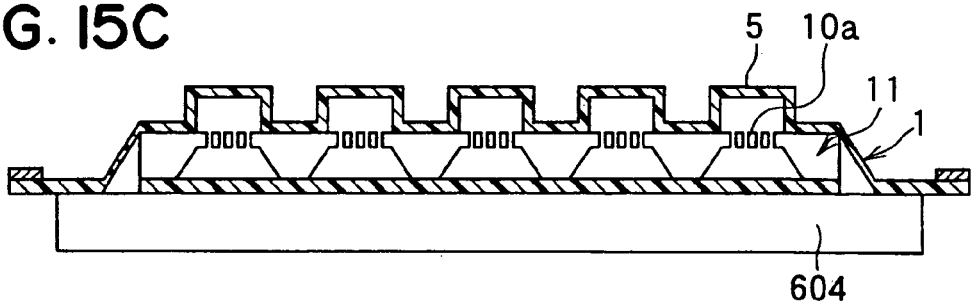

The pressure supply apparatus supplies gas such as compressed air or nitrogen ($N_2$) into the holes 3 through the pressure conduction hole 601, thereby performing the pressurization with a pressure of approximately 0.03 MPa. The cap portions 5 are not deformed by the degree of pressure. In this pressurized state, the reinforcement wafer 604 is detached from the jig 4 together with the semiconductor wafer 11 and the protective sheet 1. At that time, because the semiconductor wafer 11 is supported by the reinforcement wafer 604 at the back surface side thereof, the semiconductor wafer 11 is not deformed (warped) and damaged during the detachment. FIG. 15C shows the state after the detachment is carried out.

Figure 16A:
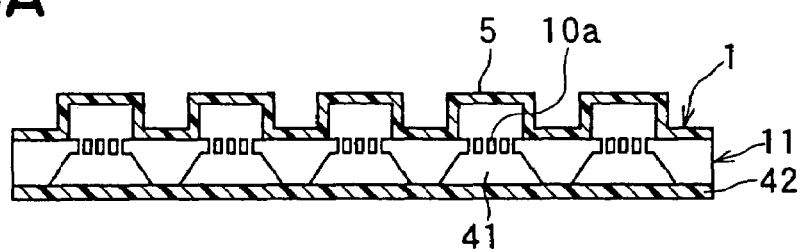
Figure 16B:
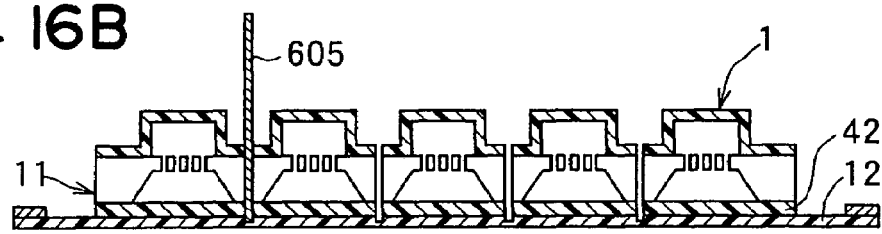
Figure 16C:
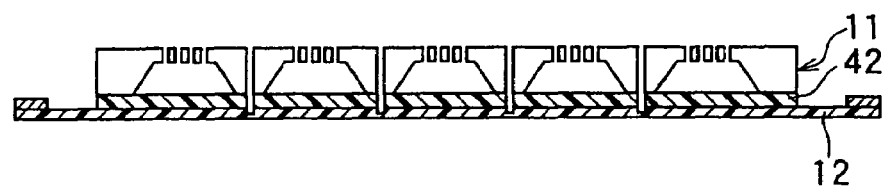

Next, at a reinforcement plate removal step shown in FIG. 16A, the outer peripheral portion of the protective sheet 1 is removed by cutting, and accordingly the reinforcement wafer 60 is removed from the semiconductor wafer 11. Because the reinforcement wafer 604 merely contacts the adhesive film 42, those separation can be performed readily. Next, as shown in FIG. 16B, a dicing sheet 12 is attached to the back surface of the adhesive film 42, and the dicing-cut step is carried out using a dicing blade 605. After that, as shown in FIG. 16C, the protective sheet 1 is removed, thereby dividing the semiconductor wafer 11 into chips. Incidentally, the jig 4, the reinforcement wafer (plate) 604, the pressure conduction hole 601, and the pressure supply apparatus (pressurizing means) cooperatively serve as a wafer detachment apparatus in the present embodiment.

According to the method in the present embodiment, after the semiconductor wafer 11 is bonded to the adhesive surface 1a of the protective sheet 1 closely fixed to the jig 4, the protective sheet 1 is detached from the jig together with the semiconductor wafer 11. When the protective sheet 1 is detached from the jig 4, a pressure is applied to the protective sheet 1 through the jig 4 in a direction in which the protective sheet 1 is detached.

Accordingly, the semiconductor wafer 11 bonded to the protective sheet 1 can be readily detached under pressure without having any damages. Thus, the wafer detachment can be performed with high workability and high throughput according to the method of the present embodiment. The reinforcement wafer 604 needs not be always adopted, but is effective to prevent the damages to the semiconductor wafer 11 more properly.

The jig 4 in the present embodiment has the recesses 2 and the holes 3 communicating with the recesses 2, and the protective sheet 1 is deformed along the recesses 2 to have the cap portions 5. The cap portions 5 protect the movable portions of the semiconductor wafer from a surface tension and a pressure of water during the dicing-cut step. On the other hand, the size of each semiconductor chip is decreased year by year, so that the number of the chips formed by one wafer is increased to, for example, 2000 to 3000.

In such a case, the large number of chips requires the same number of cap portions at least. Accordingly, the jig for forming the cap portions is required to have 2000 to 3000 recesses thereon. In this case, the protective sheet 1 is very difficult to be detached from the jig, because the protective sheet 1 is dented along the recesses. According to the present embodiment, however, the protective sheet can be readily detached even in such a case, thereby solving the problem described above.

The jig 4 may be flat only without having the recesses 2, and only holes 3 may be formed in the jig 4. In this case, the cap portions 5 are not formed to the protective sheet 1. This change does not affect the effect of easily detaching the protective sheet 1 from the jig 4 by pressurization at all. Although both vacuum attraction and pressurization are performed through the holes 3, the jig 4 can have other holes only for pressurization.

The method of the present embodiment described above does not include the protective sheet region removal step described in the first to fifth embodiments. However, even when the protective sheet removal step is carried out, the effect of the present embodiment can be exhibited as well. For example, the regions of the protective sheet 1 corresponding to the scribe regions may be removed between the step shown in FIG. 14D and the step shown in FIG. 15A. Even when the protective sheet 1 is divided accordingly, because the protective sheet 1 is fixed to the jig 4 by vacuum absorption, the divided sheet 1 is not loosed to be separated from one another.

Figure 17A:
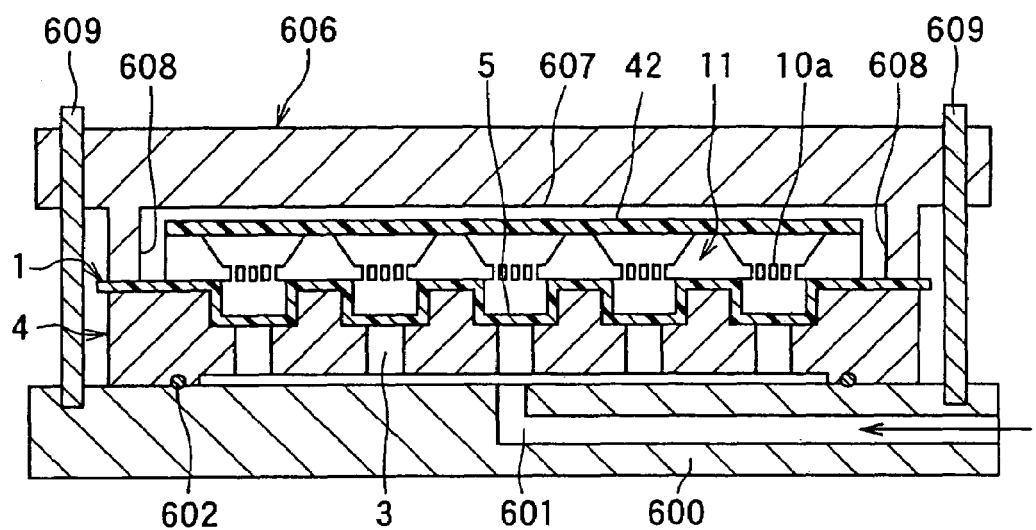
FIGS. 17A and 17B are cross-sectional views showing a method for producing the semiconductor device using a modified reinforcement plate in the sixth embodiment.
Figure 17B:
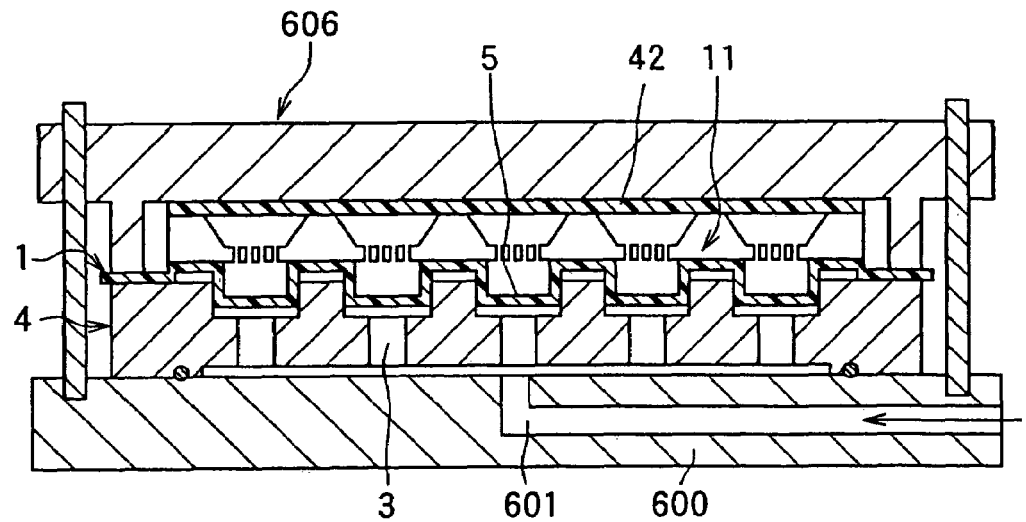

The reinforcement plate of the wafer detachment apparatus is not limited to the reinforcement wafer such as a silicon wafer, but may be a presser plate 606 shown in FIGS. 17A and 17B. In a modified embodiment shown in FIGS. 17A and 17B, the presser plate 606 is made of aluminum, and has a surface 607, and protruding portions 608 protruding from the outer peripheral portion of the surface 607 toward the jig 4. The area of the surface 607 is larger than that of the semiconductor wafer 11.

At a reinforcement plate installation step using the presser plate 606, after the vacuum attraction is stopped, as shown in FIG. 17, the presser plate 606 and the jig 4 are fastened together by fixation screws 609 inserted into screw holes of the presser plate 606 and the jig 4. Accordingly, the surface 607 of the plate 6 makes a specific gap with the adhesive film 42 bonded to the semiconductor wafer 11. The front ends of the protruding portions 608 are supported by the surface of the jig 4 through the outer peripheral portion of the protective sheet 1.

Next, at a pressurizing detachment step using the presser plate 606, as described above, the pressure is applied to the protective sheet 1 through the jig 4 in a direction in which the protective sheet 1 is to be detached. Accordingly, the protective sheet 1 is slightly separated from the jig 4 as shown in FIG. 17B. The back surface of the semiconductor wafer 11 abuts the surface 607 of the presser plate 606 through the adhesive film 42, and is supported by the surface 607. Consequently, the semiconductor wafer 11 can be prevented from being damaged more properly. After that, the fixation screws 609 are unfastened so that the presser plate 606 is detached from the semiconductor wafer 11.

As described above, the reinforcement wafer 604 is fixed to the semiconductor wafer 11 and the protective sheet 1 by the adhesive surface 1a of the protective sheet 1 adhering to the outer peripheral portion of the reinforcement wafer 604. Therefore, adhesives remain on the reinforcement wafer 604 after usage. When the reinforcement wafer 604 is reused as a reinforcement plate, it is necessary to prevent the semiconductor wafer 11 from being contaminated by the adhesives remaining on the reinforcement wafer 604. Because the positioning between the reinforcement wafer 604 and the semiconductor wafer 11 is not easy, the reinforcement wafer 604 needs to be washed before being reused to prevent the contamination to the semiconductor wafer 11.

On the other hand, the presser plate 606 described above has the protruding portions 608 at the outer peripheral portion thereof, and the protruding portions 608 support the semiconductor wafer 11. The positioning between the semiconductor wafer 11 and the presser plate 606 can be easily carried out by utilizing the protruding portions 608 as a reference. Because no adhesive adheres to the presser plate 606, there is no possibility to contaminate the semiconductor wafer 11 by the adhesive. The reinforcement presser plate 606 needs not be washed when reused, resulting in simplification of the manufacturing process.

While the present invention has been shown and described with reference to the foregoing preferred embodiments, it will be apparent to those skilled in the art that changes in form and detail may be made the rein without departing from the scope of the invention as defined in the appended claims.

For example, the semiconductor device in the present invention may be composed of a semiconductor chip encapsulated with-resin. In the embodiments described above, the protective members have various structures such as a cap portion, a gap defined by adhesives, and a recess formed by excimer laser, thereby preventing contact with the movable portions of the semiconductor wafer. However, the structure of the protective member is not limited to those. In the embodiments described above, although several protective members are formed from one protective sheet fixed to the jig, the protective members may be individually formed and fixedly arranged on the jig. The embodiments described above can be combined with one another selectively and appropriately. The present invention is not limited to a semiconductor device having a movable portion, but can be applied to other semiconductor devices and methods for producing the devices by cutting a semiconductor wafer covered with a protective sheet into chips by dicing.

What is claimed is:

1. A semiconductor sensor comprising:
a first substrate having a movable portion;
a second substrate having a conductor layer;
a bump; and
a protection sheet disposed between the first substrate and the second substrates, wherein
the first and the second substrates are laminated to each other through the bump so that the first and the second substrates are electrically connected to each other,
the movable portion of the first substrate faces the second substrate in such a manner that the movable portion and the second substrate are separated from each other by the bump,
the protection sheet is separated from and faces the movable portion so as to cap the movable portion, and
the protection sheet is disposed around the bump.

2. A semiconductor sensor comprising:
a first substrate having a movable portion;
a second substrate having a conductor layer;
a bump; and
a protection sheet disposed between the first and the second substrates, wherein
the first substrate and the second substrate are laminated to each other through the bump so that the first substrate and the second substrate are electrically connected to each other,
the movable portion of the first substrate faces the second substrate in such a manner that the movable portion and the second substrate are separate from each other by the bump,
the protection sheet is separated from and faces the movable portion so as to cap the movable portion, and
the protection sheet is made of an adhesive film.

3. The sensor according to claim 2, wherein
the protection sheet includes a concavity corresponding to the movable portion so that a part of the protection sheet is thinner than the other part of the protection sheet, and
the part of the protection sheet is separated from the movable portion.

4. The sensor according to claim 2, wherein
the protection sheet includes a convexity corresponding to the movable portion so that a part of the protection sheet protrudes in a direction opposite to the movable portion.

5. A semiconductor sensor comprising:
a first substrate having a movable portion;
a second substrate having a conductor layer;
a bump; and
a protection sheet disposed between the first substrate and the second substrate, wherein
the first substrate and the second substrate are laminated to each other through the bump so that the first substrate and the second substrate are electrically connected to each other,
the movable portion of the first substrate faces the second substrate in such a manner that the movable portion and the second substrate ate separated from each other by the bump,
the protection sheet is separated from and faces the movable portion so as to cap the movable portion, and
the protection sheet has a peripheral edge which is disposed inside of a peripheral edge of the first substrate.

6. The sensor according to claim 5, wherein
the protection sheet is disposed around the bump.

7. The sensor according to claim 5, wherein
the protection sheet covers the movable portion so that the movable portion is sealed with the protection sheet.

8. The sensor according to claim 5, wherein
the protection sheet is made of an adhesive film.

9. The sensor according to claim, 8, wherein
the protection sheet includes a concavity corresponding to the movable portion so that a part of the protection sheet is thinner than the other part of the protection sheet, and the part of the protection sheet is separated from the movable portion.

10. The sensor according to claim 8, wherein
the protection sheet includes a convexity corresponding to the movable portion so that a part of the protection sheet protrudes in a direction opposite to the movable portion.

11. The sensor according to claim 5, wherein
the protection sheet is made of an electrical insulation material.

* * * * *